(12) United States Patent
Nikaidou

(10) Patent No.: US 6,807,000 B2
(45) Date of Patent: Oct. 19, 2004

(54) GAIN MEASUREMENT DEVICE FOR OPTICAL AMPLIFIER AND METHOD THEREOF

(75) Inventor: Masahiko Nikaidou, Tokyo (JP)

(73) Assignee: NEC Corporation (JP)

(*) Notice: Subject to any disclaimer, the term of this patent is extended or adjusted under 35 U.S.C. 154(b) by 75 days.

(21) Appl. No.: 10/364,725

(22) Filed: Feb. 10, 2003

(65) Prior Publication Data
US 2003/0161034 A1 Aug. 28, 2003

(30) Foreign Application Priority Data
Feb. 22, 2002 (JP) ..................... 2002-045512

(51) Int. Cl.[7] .................. H01S 3/00; G01N 21/00
(52) U.S. Cl. .................... 359/337; 356/73.1
(58) Field of Search .............. 359/337; 356/73.1; 398/37, 177

(56) References Cited

U.S. PATENT DOCUMENTS 5,917,649 A * 6/1999 Mori et al. ............ 359/341.31
6,094,514 A * 7/2000 Kim ...................... 385/27
6,212,003 B1 * 4/2001 Komazawa et al. ..... 359/341.1

FOREIGN PATENT DOCUMENTS

JP   2001308417 A * 11/2001

* cited by examiner

Primary Examiner—Mark Hellner
(74) Attorney, Agent, or Firm—Ostrolenk, Faber, Gerb & Soffen, LLP

(57) ABSTRACT

The present invention provides a gain measurement device for an optical amplifier and measurement method therefore enable continuous measurement at high speed and high precision with quite simple construction. The device includes a first light source outputting a light for using in measurement of a plurality of wavelength points, a second light source outputting a light having a plurality of wavelengths for using in measurement of a plurality of wavelength points other than the former wavelength points, means for selectively leading out one of the output of the first light source and a multiplexed output of the outputs from the first and second sources, and measuring means for deriving the gain versus wavelength characteristics of the optical amplifier on the basis of input and output characteristics when the output of the first light source is supplied to the optical amplifier and input and output characteristics when the multiplexed output is supplied to the optical amplifier.

11 Claims, 12 Drawing Sheets

FIG. 3A
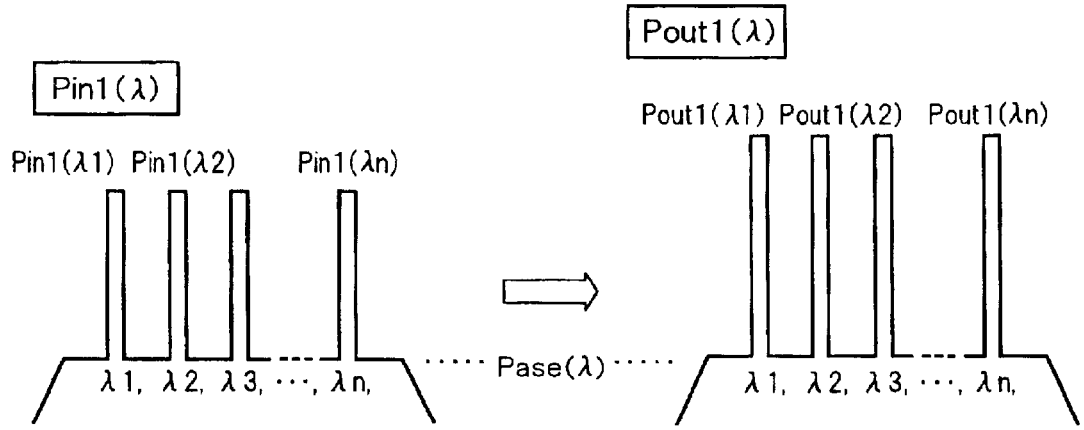
$$Pin1(\lambda) \times G(\lambda) + Pase(\lambda) = Pout1(\lambda) \cdots \cdots (1)$$
FIG. 3B
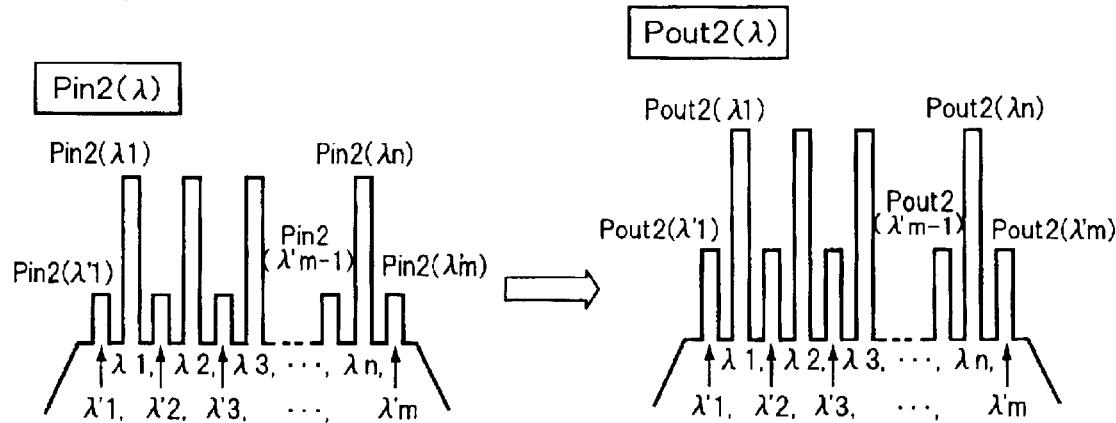
$$Pin2(\lambda) \times G(\lambda) + Pase(\lambda) = Pout2(\lambda) \cdots \cdots (2)$$
FIG. 3C
FROM EXPRESSIONS (1) & (2);
$$G(\lambda) = \{Pout2(\lambda) - Pout1(\lambda)\} / \{Pin1(\lambda) - Pin2(\lambda)\} \cdots (3)$$

FIG. 9A
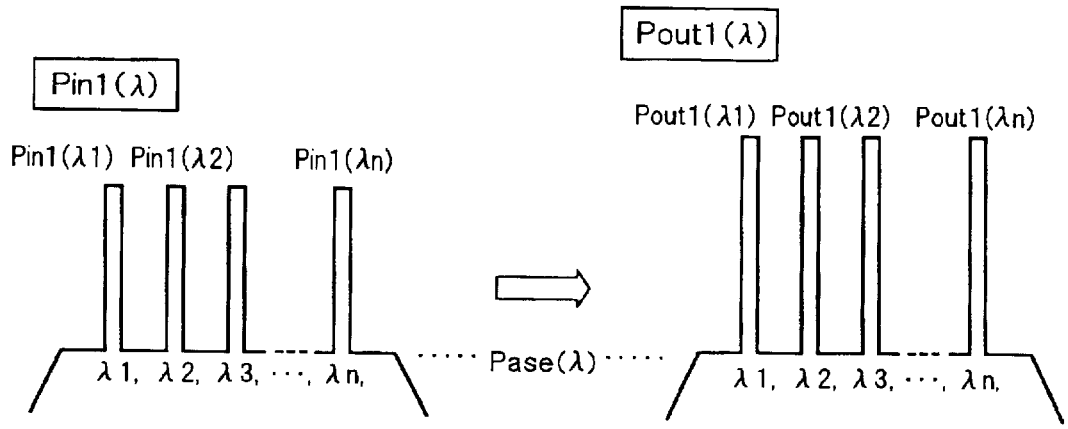
$$Pin1(\lambda) \times G(\lambda) + Pase(\lambda) = Pout1(\lambda) \cdots\cdots (1)$$
FIG. 9B
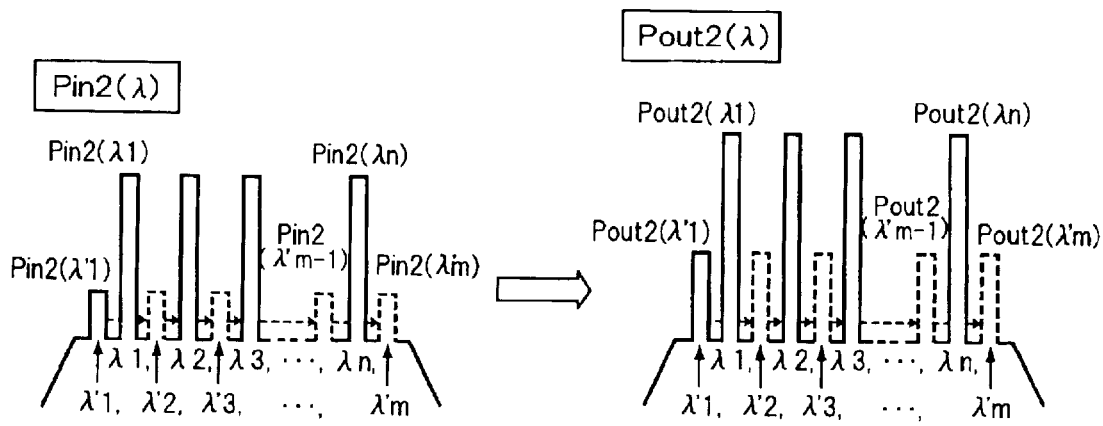
$$Pin2(\lambda) \times G(\lambda) + Pase(\lambda) = Pout2(\lambda) \cdots\cdots (2)$$
FIG. 9C
FROM EXPRESSIONS (1) & (2);
$$G(\lambda) = \{Pout2(\lambda) - Pout1(\lambda)\} / \{Pin1(\lambda) - Pin2(\lambda)\} \cdots\cdots (3)$$

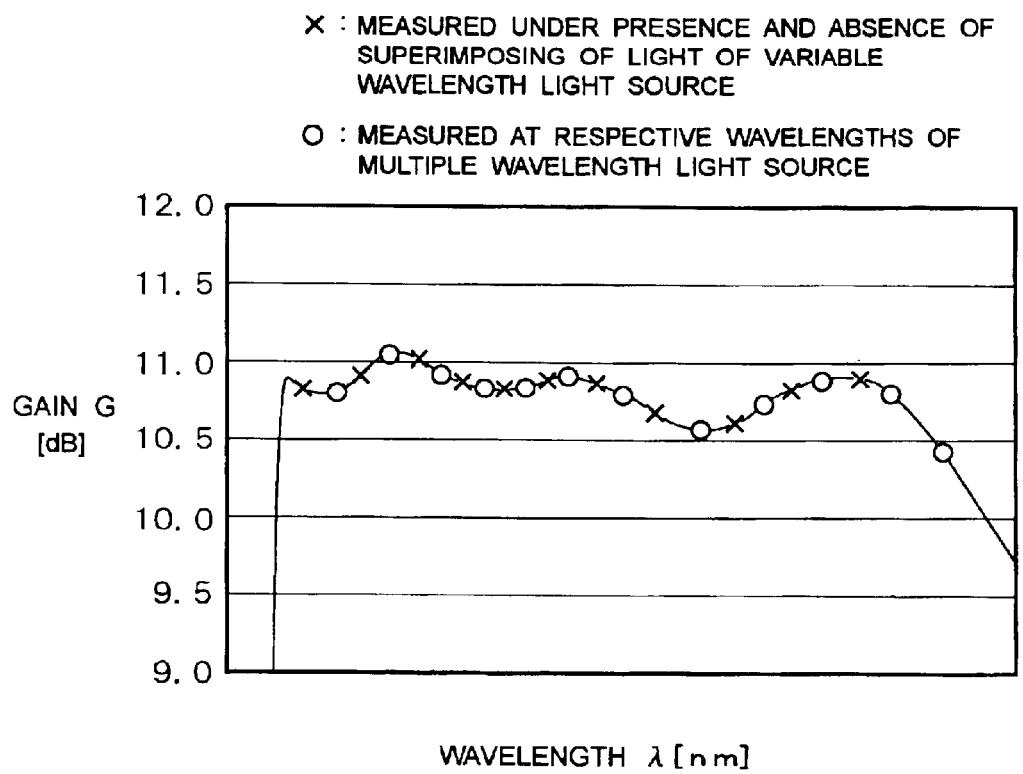

GAIN MEASUREMENT DEVICE FOR OPTICAL AMPLIFIER AND METHOD THEREOF

BACKGROUND OF THE INVENTION

1. Field of the Invention

The present invention relates generally to a gain measurement device for an optical amplifier. More particularly, the invention relates to gain measurement device and method for an optical amplifier which can continuously measure gain versus wavelength characteristics of an optical amplifier to be measured at high speed and high precision.

2. Description of the Related Art

Conventionally, in an optical communication, such as a wavelength division multiplexing communication to be used for a large capacity and long distance optical transmission system, for example, level deviations between respective channels (wavelength) cause deterioration of signals. On the other hand, in the long distance transmission, characteristics of the optical amplifiers to be used at appropriate interval are important factor to cause deterioration of signals. Accordingly, in addition to low-noise characteristics and high efficiency are required for the optical amplifier, flattening and widening of band of a gain versus wavelength are required. For this purpose, evaluation of the gain versus wavelength characteristics of the foregoing optical amplifier has been heretofore important.

FIG. 6 is an illustration for explaining the conventional gain measuring system for the optical amplifier of this kind. Referring to FIG. 6, a multiple wavelength light source 10 is designed for outputting saturated lights having a plurality of predetermined wavelengths $\lambda 1$ to $\lambda n$. A variable wavelength light source 112 is designed for outputting a fine probe light of variable wavelength. A polarization scrambler 113 is designed to make a light polarization surface for the variable wavelength fine (very little) probe light to output a polarized light to an optical coupler 11. The optical coupler 11 multiplexes the output from the multiple wavelength light source 10 and the output from the polarization scrambler 113. A variable light attenuator 14 is designed for performing level control of the output from the optical coupler 11 depending upon a control signal from a control portion 21.

An optical switch 15 receives an output of the optical attenuator 14 at an input port 15a to selectively output through one of output ports 15b and 15c. A measurement objective optical amplifier 16 has an input 16a connected to one output port 15c of the optical switch 15 and an output 16b connected to one input port 17b of an optical switch 17 at a next stage. The other output port 15b of the optical switch 15 is connected to an input port 17a of the optical switch 17. The optical switch 17 is designed to arbitrarily establish connection between two input ports 17a and 17b and two output ports 17c and 17d.

The output port 17c of the optical switch 17 is connected to a light power meter 18. The other output port 17d of the optical switch 17 is connected to an optical spectrum analyzer 19. Outputs of the optical power meter 18 and the optical spectrum analyzer 19 are fed to a gain measuring portion 20. An output of the optical power meter 18 is input a control portion 21.

FIGS. 7 and 8 are operational flowchart for explaining a gain measurement process of the conventional optical amplifier shown in FIG. 6. In FIG. 7, at first, control is performed so that only multiple wavelength lights ($\lambda 1$ to $\lambda n$) from the multiple wavelength light source 10 are input to the measurement objective optical amplifier 16. At this condition, the control portion 21 monitors an input power of the measurement objective optical amplifier 16 by the optical power meter 18 to control an attenuation amount (ATT amount) of the variable optical attenuator 14 so that the input power becomes a rated (nominal) value (Pnom) (step S01).

At this condition, by employing the optical spectrum analyzer 19, an input spectrum Pin1($\lambda$) of the input for the measurement objective optical amplifier 16 is measured (step S102). The input spectrum at this time is shown on left side of FIG. 9A. In the condition where only lights having wavelengths $\lambda 1$ to $\lambda n$ of the multiple wavelength light source are input, an output spectrum Pout1 of the measurement objective optical amplifier 16 is measured by means of the optical spectrum analyzer 19 (step S103). The output spectrum at this time is shown on right side of FIG. 9A.

Here, as shown in FIG. 10, a relationship between an input and an output of the optical amplifier 16 is expressed by:

$$Pin \times G + Pase = Pout$$

wherein G is a gain, Pase is a power of a spontaneous emission light.

Accordingly, when only lights having wavelengths $\lambda 1$ to $\lambda n$ of the multiple wavelength light source is input, the relationship between input and output of the optical amplifier 16 is expressed by an expression (1) of FIG. 9A.

Thereafter, the light of the multiple wavelength light source 10 and the fine probe light by the variable wavelength light source 112 are superimposed to be input to the measurement objective optical amplifier 16. Then, the control portion 21 monitors the input power of the amplifier by means of the optical power meter 18 for controlling attenuation amount of the variable optical attenuator 14 in order to maintain the input power at the rated value (step S104). At this time, a wavelength of the probe light emitted from the variable wavelength light source 112 is assumed to be set at $\lambda'1$.

At this condition, an input spectrum Pin2 ($\lambda$) of the measurement objective optical amplifier 16 is measured by means of the optical spectrum analyzer 19 (step S105). The input spectrum to the measurement objective optical amplifier 16 at this condition is shown on the left side (solid line) of FIG. 9B. Then, an output spectrum Pout2 ($\lambda$) of the measurement objective optical amplifier 16 is measured by means of the optical spectrum analyzer 19 (step S106). The output spectrum at this time is shown on right side of FIG. 9B.

Next, the wavelength of the variable wavelength light source 112 is varied to $\lambda'2$ (see FIG. 9B) to repeat the foregoing process through steps S104 to S106 (step S107). Similarly, for $\lambda'3$ to $\lambda'm$, the process through steps S104 to S106 is repeated respectively (steps S108 to S109). Finally, the expression (2) of FIG. 9B can be obtained. A solution of the expressions (1) and (2) is obtained with respect to G($\lambda$) to establish an expression (3) as shown in FIG. 9C (step S110 of FIG. 8). G($\lambda$) obtained from the expression (3) is indicative of a gain G($\lambda'1$), . . . , G($\lambda'm$) of wavelength ($\lambda'1$ to $\lambda'm$) of the variable wavelength light source. On the other hand, gains G ($\lambda 1$), . . . , G ($\lambda n$) of wavelength $\lambda 1$ to $\lambda n$ of the multiple wavelength light source obtained from the expression (1) of FIG. 9A obtained from the input and output spectrum in the process through steps S101 to S103, namely, in the condition where only the light from the multiple wavelength light source 10 is input, are obtained arithmetically (step S111).

From these steps S110 to S111, gain versus wavelength characteristics in full wavelength band of the measurement objective optical amplifier 16 can be derived (step S112). One example of the result of measurement is shown in FIG. 11.

In the conventional gain measurement method of the foregoing optical amplifier, it becomes necessary to repeat processes for setting wavelength of the variable wavelength light source 112, setting of the optical spectrum analyzer 19 and so forth per wavelength to be measured. Accordingly, when number of wavelengths to be measures is increased, the measurement period is proportionally expanded.

On the other hand, as shown in FIG. 6, the output of the variable wavelength light source 112 has to be non-polarized wave employing the polarized scrambler 113.

The reason is that since output light of the variable wavelength light source is single polarized wave to encounter a problem in power stability and so forth, it becomes necessary to convert the output light into non-polarized wave light having higher power stability by means of the polarized wave scrambler. Accordingly, the polarized wave scrambler is required as additional hardware. Furthermore, construction and control mechanism for variation of wavelength of the variable wavelength light source 112 to make the device complicate.

SUMMARY OF THE INVENTION

It is an object of the present invention to provide a gain measurement device for an optical amplifier and measurement method therefore which permits continuous measurement at high speed and high precision with quite simple construction.

According to the first aspect of the present invention, a gain measurement device for measuring a gain versus wavelength characteristics of an optical amplifier, comprises:

a first light source outputting a light having a plurality of wavelengths for using in measurement of a plurality of wavelength points;

a second light source outputting a light having a plurality of wavelengths for using in measurement of a plurality of wavelength points other than the plurality of wavelength points;

means for selectively leading out one of the output of the first light source and a multiplexed output generated by multiplexing the output of the second light source with the output of the first light source; and measuring means for deriving the gain versus wavelength characteristics of the optical amplifier on the basis of input and output characteristics when the output of the first light source is supplied to the optical amplifier and input and output characteristics when the multiplexed output is supplied to the optical amplifier.

In the preferred construction, the second light source includes a wide band light source outputting a light of wide band covering entire measurement band of the optical amplifier, and optical filtering means having a filtering characteristics for passing light of all measuring wavelength points other than the wavelength points to be measured in connection with the light of the first light source with taking the output of the wide band light source as input and blocking otherwise. The light filtering means may include a first arrayed-waveguide grating taking the output of the wideband light source as input to selectively demultiplex the light of entire measuring wavelength points other than the wavelength points to be measured in connection with the light of the first light source, and a second arrayed-waveguide grating multiplexing the lights demultiplexed by the first arrayed-waveguide grating. In the alternative, the optical filtering means may include a circulator taking the output of the wide band light source as input for a first port, and a plurality of fiber grating cascade connected sequentially to output from a second port of the circulator reflecting light of the entire measuring wavelength points other than the wavelength points to be measured in connection with the light of the first light source, and an output from a third port of the circulator is taken as output of the optical filtering means.

Also, the measuring means may includes a spectrum analyzer measuring spectra of input and output when the output of the first light source is supplied to the optical amplifier and measuring spectra of input and output when the multiplexed output is supplied to the optical amplifier, and means for measuring the gain versus wavelength characteristics on the basis of results of measurement by the spectrum analyzer.

Preferably, the gain measurement device may further comprise:

a variable optical attenuator controlling an input optical power to the optical amplifier;

an optical power meter measuring an input power to the optical amplifier; and control means for controlling the variable optical attenuator on the basis of an output of the optical power meter so that the input optical power becomes a rated value.

According to the second aspect of the present invention, a gain measurement method for measuring a gain versus wavelength characteristics of an optical amplifier, comprises:

step of supplying a light having a plurality of wavelengths for using in measurement of a plurality of wavelength points from a first light source to an input of the optical amplifier;

step of multiplexing an output light from the first light source and an output light having a plurality of wavelengths from a second light source for using in measurement of wavelength points other than the wavelength points to be measured in connection with the light of the first light source to supply a multiplexed output to the input of the optical amplifier; and measuring step of deriving the gain versus wavelength characteristics of the optical amplifier on the basis of input and output characteristics when the output of the first light source is supplied to the optical amplifier and input and output characteristics when the multiplexed output is supplied to the optical amplifier.

Preferably, the output light from the second light source maybe generated by operating a wide band light source for emitting a wide band light covering entire measurement band of the optical amplifier, and inputting the output of the wide band light source to optical filtering means having characteristics for passing light having entire measuring wavelength points other than the wavelength points to be measured in connection with the light of the first light source and blocking otherwise.

In the preferred process, the measuring step comprises:

step of measuring spectra of input and output when the output of the first light source is supplied to the optical amplifier and spectra of input and output when the multiplexed output is supplied to the optical amplifier; and step of measuring the gain versus wavelength characteristics based on the results of measurement.

Also, the gain measurement method may further comprise:

step of measuring an input optical power to the optical amplifier by means of an optical power meter;

step of controlling the input optical power to the optical amplifier on the basis of an output of the optical power meter so that the input power to the optical amplifier becomes a rated value.

According to the third aspect of the present invention, a storage medium recording a program for implementing a gain measuring method for measuring a gain versus wavelength characteristics of an optical amplifier, the program comprises:

step of supplying a light having a plurality of wavelengths for using in measurement of a plurality of wavelength points from a first light source;

step of multiplexing an output light from the first light source and an output light having a plurality of wavelengths from a second light source for using in measurement of wavelength points other than the wavelength points to be measured in connection with the light of the first light source; and measuring step of deriving the gain versus wavelength characteristics of the optical amplifier on the basis of input and output characteristics when the output of the first light source is supplied to the optical amplifier and input and output characteristics when the multiplexed output is supplied to the optical amplifier.

In the operation of the present invention, in addition to the multiple wavelength light source, the wavelength selective light source in which spontaneous emission light from the wide band light source is output after filtering through the optical filter so that outputs of the multiple wavelength light source becomes lights at wavelength points other than that of the multiple wavelength light source, provided separately from the spontaneous emission light (Pase) generated and amplified in the measurement objective optical amplifier, are provided. In case where the light (Pbase) of a plurality of wavelength points from the wavelength selective light source and the light from the multiple wavelength light source are superimposed with each other and in case of only light from the multiple wavelength light source, input and output spectra to and from the measurement objective optical amplifier are measured separately for performing measurement of gain versus wavelength characteristics of the measurement objective optical amplifier on the basis of the result of measurement of the input and output spectra for evaluation.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIGS. 3A, 3B and 3C are illustrations for explaining a method for measuring gain versus wavelength characteristics of the gain measurement device according to the present invention;

FIGS. 9A, 9B and 9C are illustrations for explaining the conventional gain measuring method for the optical amplifier;

FIG. 11 is an illustration showing one example of finally obtained gain versus wavelength characteristics of the optical amplifier.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details.

Figure 1:
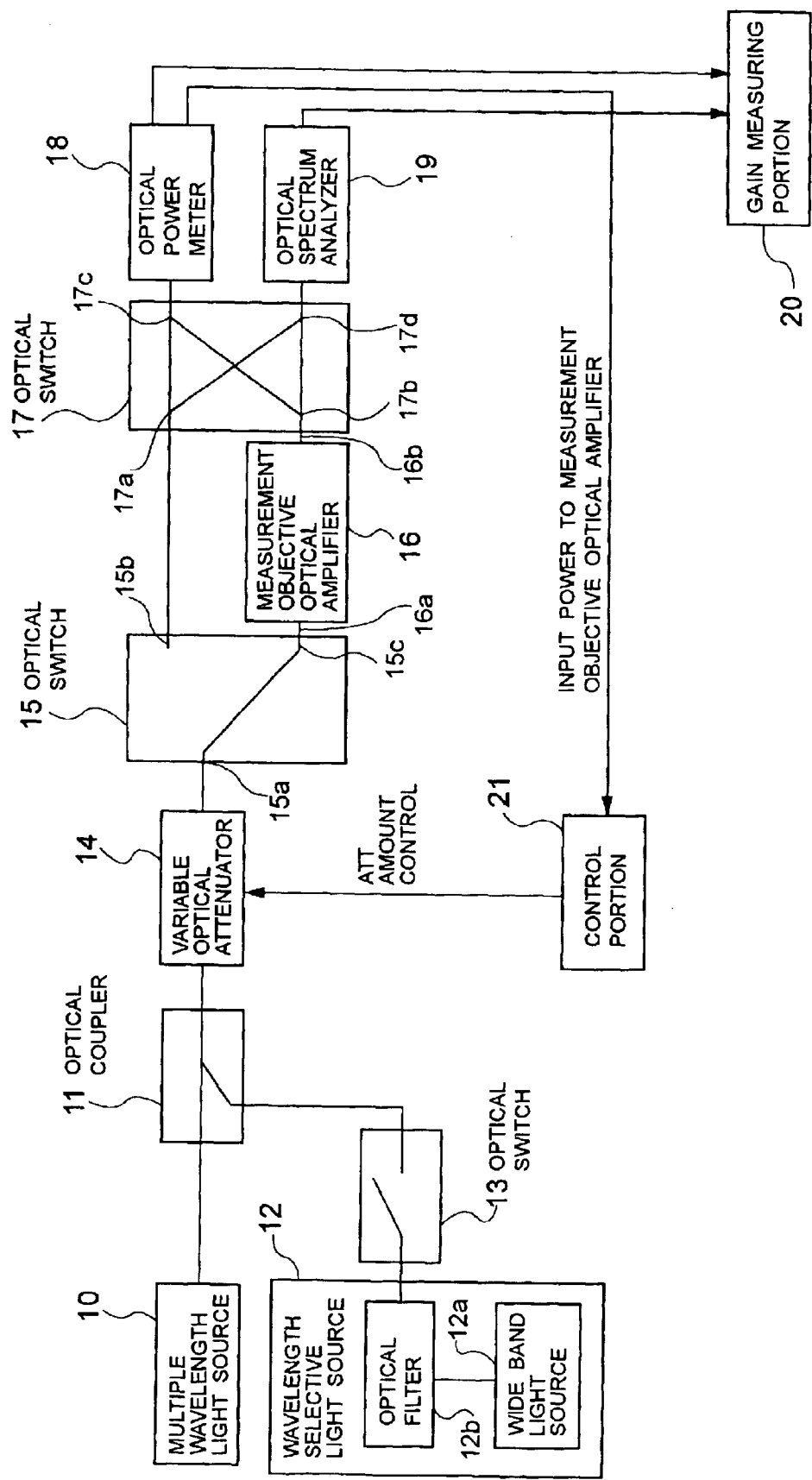
FIG. 1 is a functional block diagram showing the preferred embodiment of a gain measurement device for an optical amplifier according to the present invention.
Figure 6:
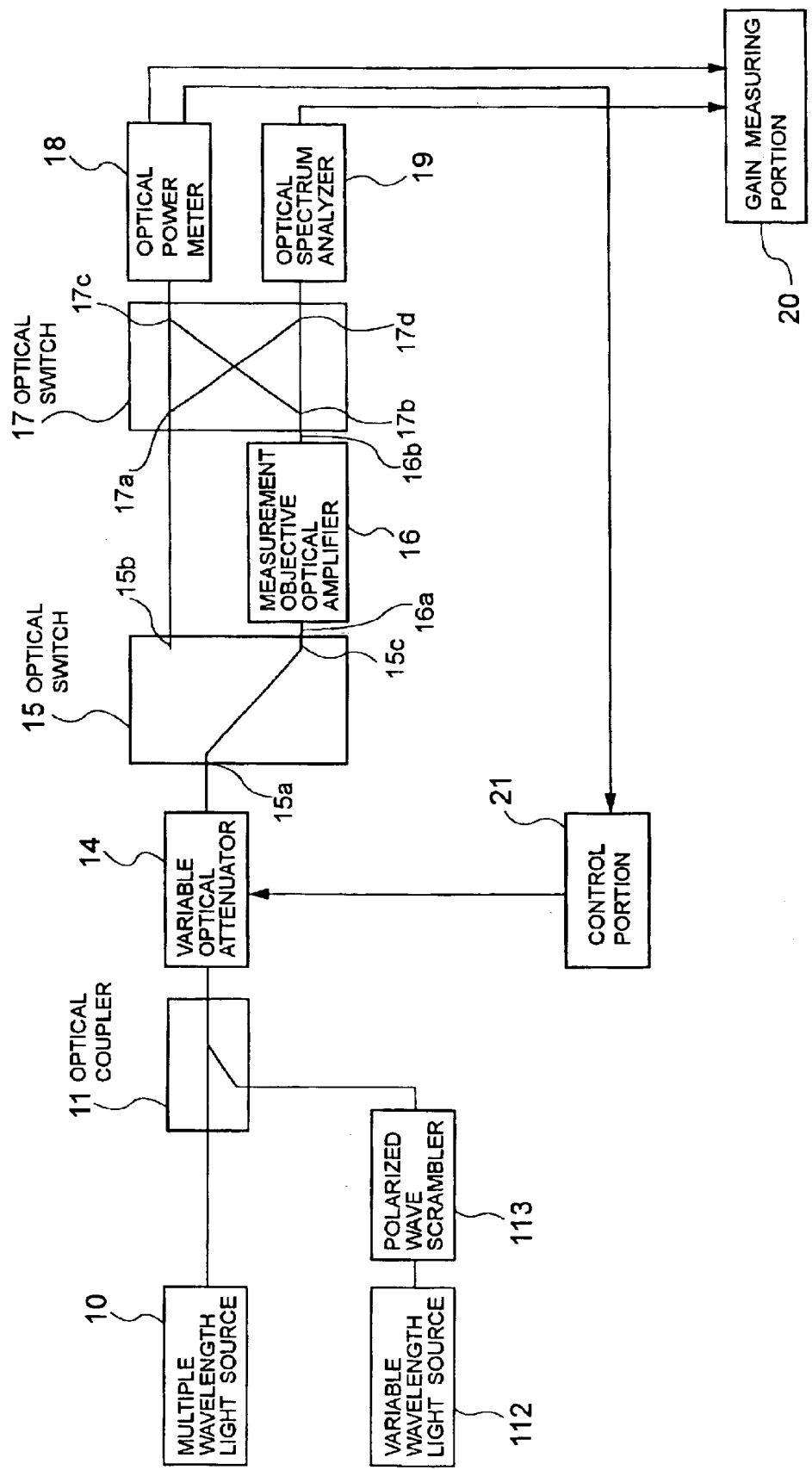
FIG. 6 is a functional block diagram of the conventional gain measurement device for the optical amplifier.
Figure 7:
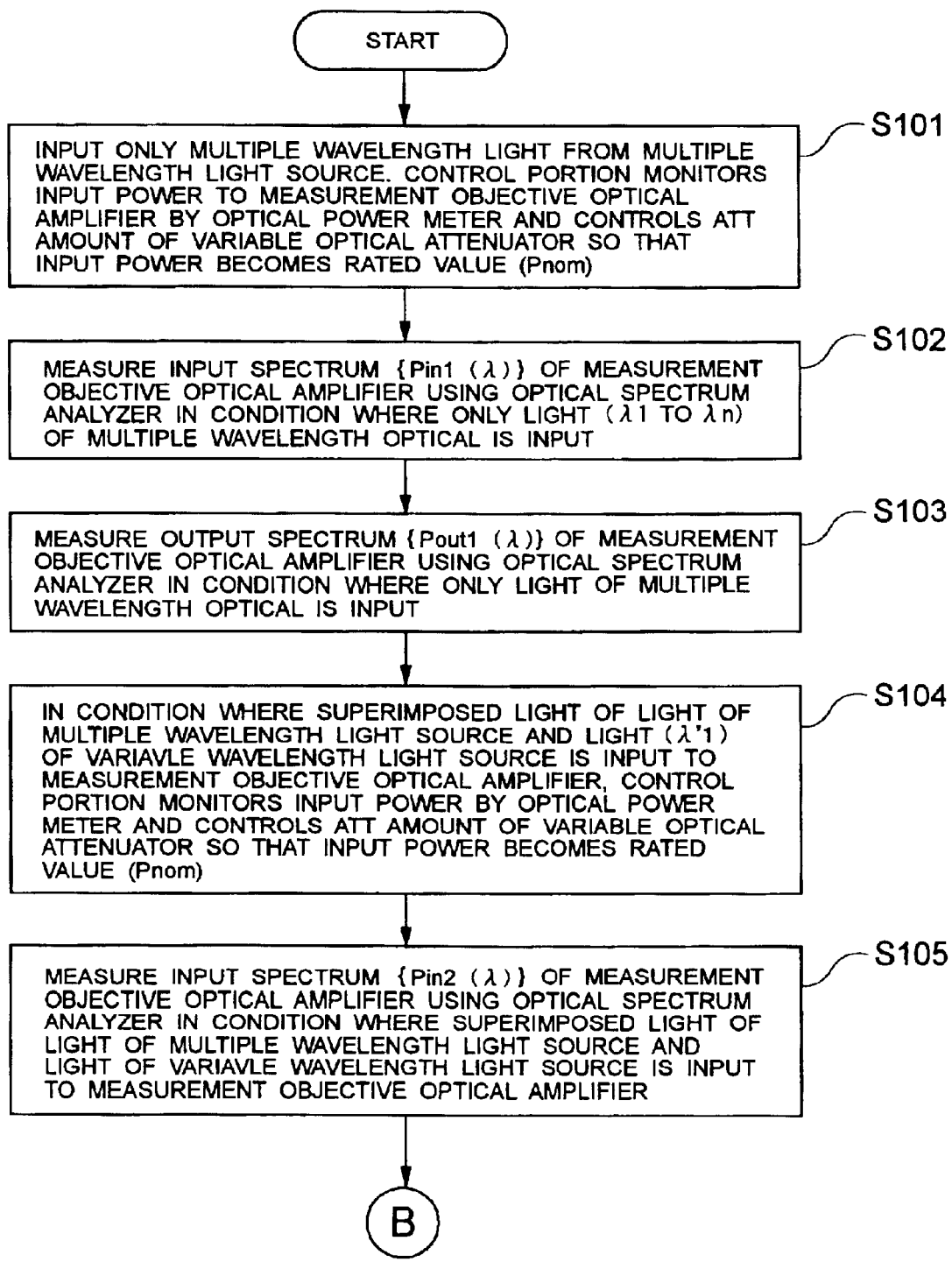
FIG. 7 is a partial flow chart showing operation of the conventional gain measuring method for the optical amplifier.
Figure 8:
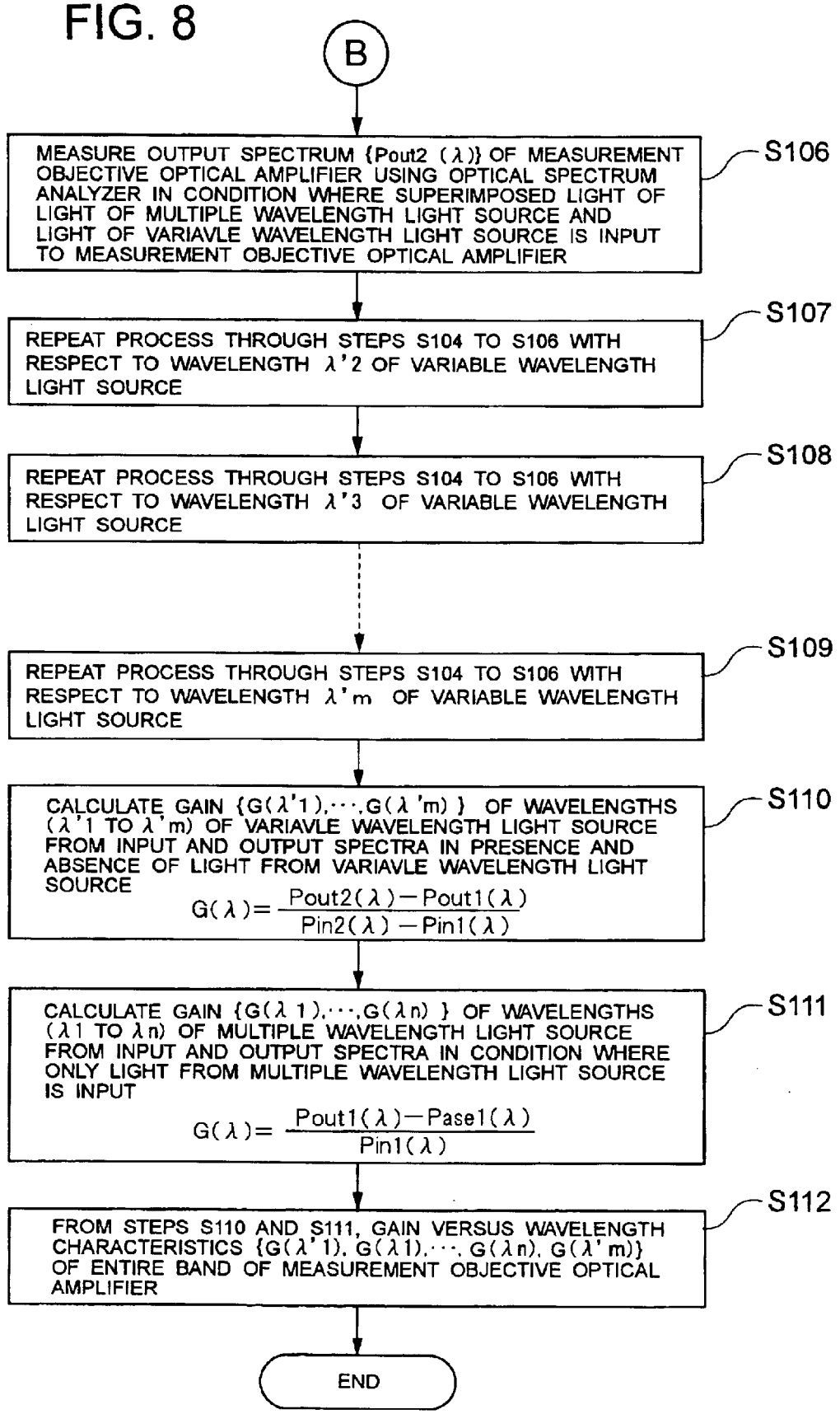
FIG. 8 is a partial flow chart showing operation of the conventional gain measuring method for the optical amplifier.

FIG. 1 is a schematic block diagram showing the preferred embodiment of a gain measurement device for an optical amplifier according to the present invention, like components to those common to FIG. 6 will be identified by like reference numerals. On an input side of the optical amplifier 16 as object for measurement (hereinafter referred to as "measurement objective optical amplifier"), the multiple wavelength light source 10 which makes the measurement objective optical amplifier 16 in saturated condition, a wavelength selective light source 12, an optical coupler 11 multiplexing lights from these light sources 10 and 12, an optical switch 13, the variable light attenuator 14 performing level adjustment of the multiplexed output of the optical coupler, and the optical switch 15 are provided.

The wavelength selective light source 12 has a wide band light source 12a covering an entire measurement band, and an optical filter 12b passing lights of entire measuring wavelength points other than the multiple wavelength light source 10 and blocking otherwise. The wideband light from the wideband light source 12a covering entire measurement band is input to the optical filter 12b for simultaneously outputting a plurality lights at respective measuring wavelength points.

On the output side of the optical amplifier 16, the optical switch 17, the optical power meter 18, the optical spectrum analyzer 19 and the gain measuring portion 20 measuring gain versus wavelength characteristics of the measurement objective optical amplifier 16 by using the outputs of the optical power meter 18 and the optical spectrum analyzer 19. On the other hand, the control portion 21 is provided for controlling attenuation amount of the variable optical attenuator 14 depending upon the output of the optical power meter 18.

It should be noted that the optical switch 13 switches for controlling whether the output light from the wavelength selective light source 12 is to be supplied to the optical coupler 11 or not. The optical switches 15 and 17 have identical construction and function as the optical switches 15 and 17 of FIG. 6.

In the preferred embodiment illustrated in FIG. 1, different from the conventional method as illustrated in FIG. 6, the foregoing multiple wavelength light source 10 and the wavelength selective light source 12 in which spontaneous emission light from the wide band light source 12a is output after filtering through the optical filter 12b so that outputs of the multiple wavelength light source becomes lights at wavelength points other than that of the multiple wavelength light source, provided separately from the spontaneous emission light (Pase) generated and amplified in the measurement objective optical amplifier 16, are provided. In case where the light (Pbase) of a plurality of wavelength points from the wavelength selective light source 12 and the light from the multiple wavelength light source 10 are superimposed with each other and in case of only light from the multiple wavelength light source 10, input and output spectra to and from the measurement objective optical amplifier 16 are measured separately for performing measurement of gain versus wavelength characteristics of the measurement objective optical amplifier 16 on the basis of the result of measurement of the input and output spectra for evaluation.

Construction of the shown embodiment will be discussed in more detailed hereinafter. The optical coupler 11 is provided in order to superimpose the multiple wavelength light of the multiple wavelength light source 10 and the light output from the wavelength selective light source 12. Also, in the input side of the optical amplifier 16, the first optical switch 15 is provided for selectively supplying the light passing through the optical coupler 11 to the optical spectrum analyzer 19 via the optical amplifier 16 or directly to the optical spectrum analyzer 19 without passing through the measurement objective light source 16.

Furthermore, in the shown embodiment, the variable optical attenuator 14 is provided between the optical coupler 11 and the first optical switch 15. Also, the optical power meter 18 is provided on the output sides of the first optical switch 15 and the optical amplifier 16 so that the variable optical attenuator 14 may adjust the input power to the measurement objective optical amplifier 16 to the rated power depending upon the output of the optical power meter 18.

On the other hand, the second optical switch 17 is provided between the first optical switch 15 and the optical spectrum analyzer 19. By switching operation of the second optical switch 17, the light passing through the first optical switch 15 and the light passing through the optical amplifier 16 are selectively fed to the optical power meter 18 or the optical spectrum analyzer 19.

In addition, the third optical switch 13 designed for selectively feeding the light from the wavelength selective light source 12 to the optical coupler 11, is provided between the wavelength selective optical source 12 and the optical coupler 11. Namely, the preferred embodiment of the gain measurement device according to the present invention is constructed with the multiple wavelength light source 10 for placing the measurement objective optical amplifier 16 in a saturated condition, the wavelength selective light source 12 to be used for measurement of the wavelength point other than the wavelengths of the multiple wavelength light source, the optical coupler 11 for superimposing the light of the multiple wavelength light source and the output light of the wavelength selective light source, the optical switch 13 enabling and disabling superimposition in the optical coupler 11, the variable optical attenuator 14 adjusting the input power of the measurement objective optical amplifier 16 to the rated power, the optical switch 15 for switching route of the optical input signal to the measurement objective optical amplifier 16 and the measuring device, the optical switch 17 for switching the optical input and output signals and the optical power meter 18, the optical spectrum analyzer 19, the optical power meter 18, the optical spectrum analyzer 19 and the measurement objective optical amplifier 16. It becomes possible to measure the continuous gain versus wavelength characteristics of the measurement objective optical amplifier 16 at high speed and high precision from four kinds of optical spectra including the input and output spectra when the optical switch 13 is placed in open condition and the input and output spectra when the optical switch 13 is placed in closed condition.

One particular embodiment of the gain measuring method in the preferred embodiment illustrated in FIG. 1 will be discussed with reference to the flowchart of FIG. 2. At first, placing the optical switch 13 in open condition, only multiple wavelength light ($\lambda 1$ to $\lambda n$) of the multiple wavelength light source 10 is supplied to the optical power meter 18 via the optical coupler 11, the variable optical attenuator 14, the input port 15a and the output port 15b of the optical switch 15, the input port 17a and the output port 17c of the optical switch 17. Also, the variable optical attenuator 14 is controlled by the control portion 21 so that the optical power value measured by the optical power meter 18 may be consistent with a rated input power (Pnom) condition (step S1).

Then, the optical switch 17 is switched to establish connection between the port 17a and the port 17d to measure the input spectrum Pin1 ($\lambda$) of the entire measurement band by means of the optical spectrum analyzer 19 (step S2). The input spectrum at this time is illustrated on left side of FIG. 3A. Then, connection is established between the power 17b and the port 17d by the optical switch 17 to measure the output spectrum Pout1 ($\lambda$) of the entire measurement band of the measurement objective optical amplifier 16 by means of the optical-spectrum analyzer 19 (step S3). The output spectrum at this condition is illustrated on right side of FIG. 3A.

Figure 10:
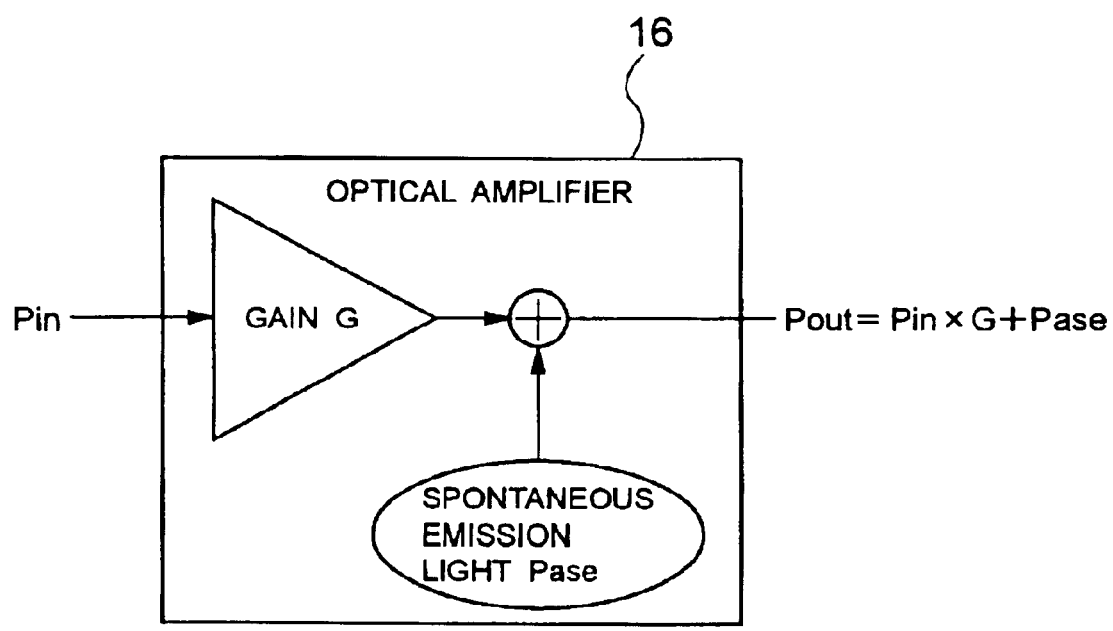
FIG. 10 is an illustration showing a relationship between input and output in the optical amplifier.

Here, as shown in FIG. 10, a relationship between the input and output of the optical amplifier 16 is expressed by:

$$Pin \times G + Pase = Pout$$

A relational expression of the input and output of the optical amplifier 16 is as shown by the expression (1) of FIG. 3A.

Thereafter, the superimposing light of the lights emitted from the multiple wavelength light source 10 and the wavelength selective light source 12 is obtained using the optical switch 13 and the optical coupler 11. Then, the superimposing light is input to the measurement objective optical amplifier 16. At this condition, the control portion 21 monitors the input power by the optical power meter 18 to control attenuation amount of the variable optical attenuator 14 so that the input power becomes the rated value (Pnom) (step S4). The output wavelengths of the wavelength selective light source 12 at this time are assumed to be set at $\lambda'1$ to $\lambda'm$.

At this condition, the input spectrum Pin2 ($\lambda$) of the measurement objective optical amplifier 16 is measured using the optical spectrum analyzer 19 (step S5). The input spectrum to the measurement objective optical amplifier 16 at this condition is shown on left side of FIG. 3B. Then, the output spectrum Pout2 (λ) of the measurement objective optical amplifier 16 is measured (step S6). The output spectrum at this time is shown on right side of FIG. 3B. As a result, a relational expression of the input and output of the optical amplifier 16 is established as shown by expression (2) of FIG. 3B.

Resolving the expressions (1) and (2) with respect to G (λ) an expression (3) shown n FIG. 3C is derived (step S7) G (λ) obtained by the expression (3) becomes gain G (λ'1), . . . , G (λ'm) of respective wavelengths (λ'1 to λ'm) of the wavelength selective light source 12. On the other hand, in the process through steps S1 to S3, namely by the expression (1) in FIG. 3A obtained from the input and output spectra in the condition where only light of the multiple wavelength light source 10 is input, gains G (λ'1), . . . , G (λ'n) of respective wavelengths λ1 to λn of the multiple wavelength light source are arithmetically derived, respectively (step S8). It should be noted that methods for deriving gains of respective wavelengths of the multiple wavelength light source is as set out in connection with the prior art. This method is known as so-called ASE (Amplified Spontaneous Emission) interpolation method.

Through the foregoing steps, the gain versus wavelength characteristics of the entire wavelength band of the measurement objective optical amplifier 16 can be obtained in similar manner as that illustrated in FIG. 11 (step S9).

Figure 4:
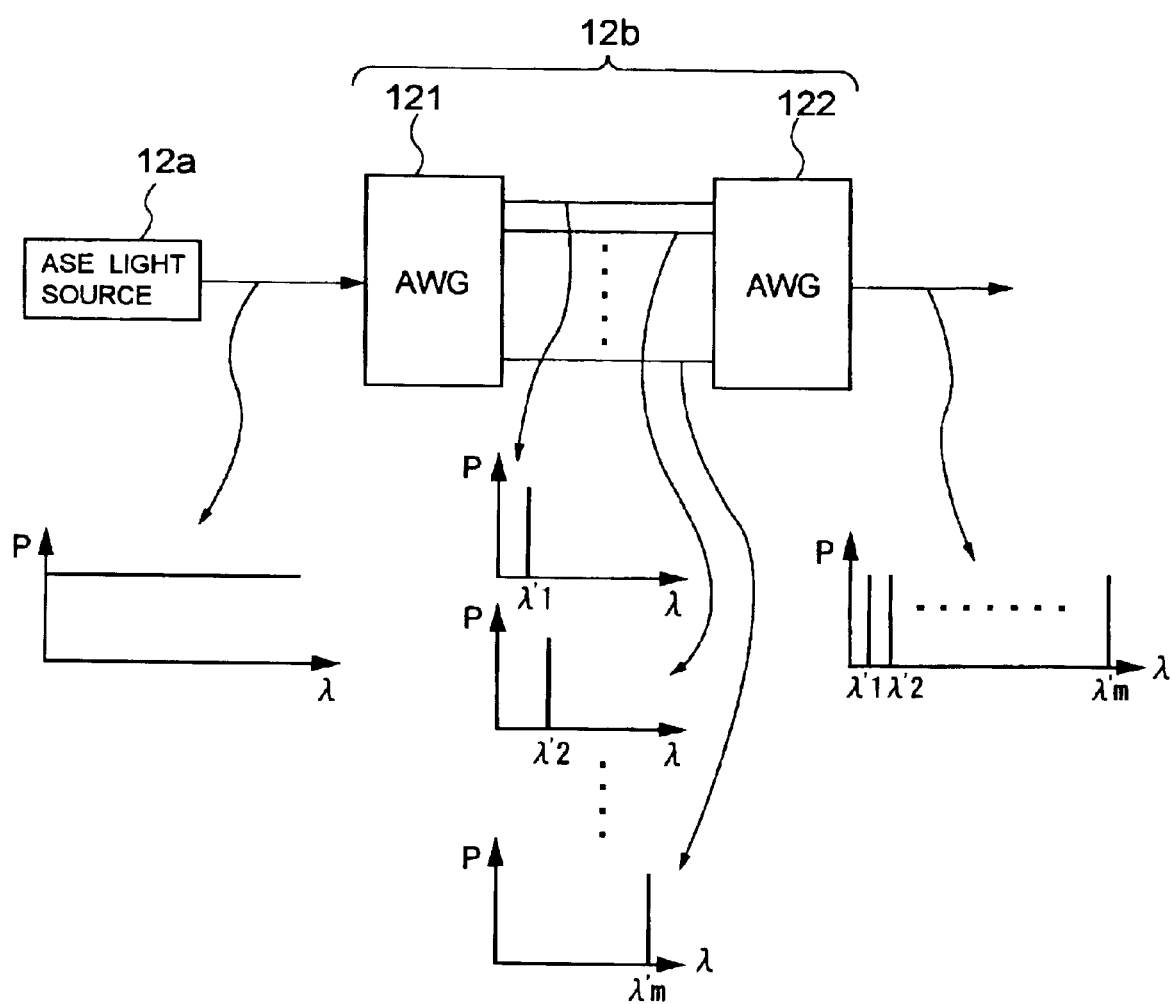
FIG. 4 is an illustration showing one embodiment of a wavelength selective light source in FIG. 1.

FIG. 4 is a block diagram showing one embodiment of the wavelength selective light source 12 shown in FIG. 1. As shown in FIG. 4, the wavelength selective light source 12 includes an ASE (Amplified Spontaneous Emission) light source 12a, an AWG (Arrayed-Waveguide Grating) 121 taking a light from the ASE light source 12a (hereinafter referred to as "ASE light") and an AWG 122 taking the output of the AWG 121 as input. The ASE light source 12a is designed for generating a wide band light covering entire band of the measurement objective optical amplifier 16. The AWG 121 at the first stage has a separating function for demultiplexing the input ASE light into lights respectively having wavelengths λ'1, λ'2, . . . , λ'm. The AWG 122 at the next stage has a function for multiplexing the lights having respective wavelengths demultiplexed by the AWG 121.

Figure 5:
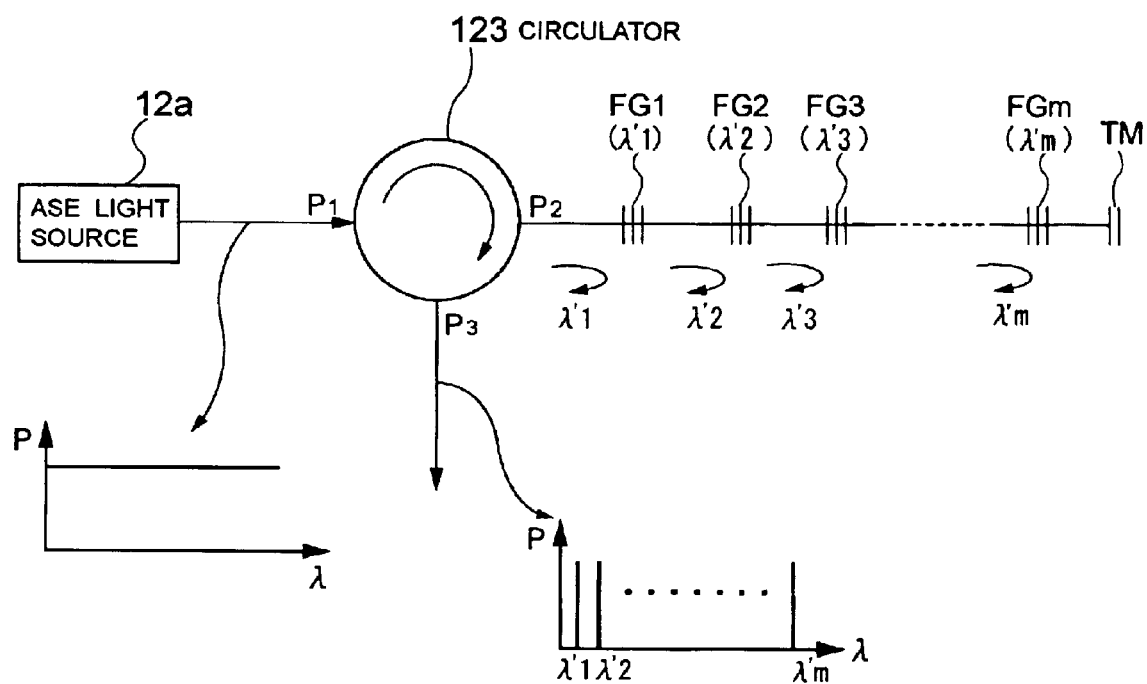
FIG. 5 is an illustration showing another embodiment of the wavelength selective light source in FIG. 1.

FIG. 5 is a block diagram showing another embodiment of the wavelength selective light source 12 shown in FIG. 1. Referring to FIG. 5, the wavelength selective light source 12 is constructed with the ASE light source 12a, a circulator 123 taking the ASE light as input for the port P1, fiber gratings FG1 to FGm sequentially connected in cascade connection at the output of the port P2 of the circulator 123, and a non-reflective terminator TM. An output of the wavelength selective light source can be obtained from the port P3 of the circulator 123.

The fiber grating FG1 has a function to pass wavelengths other than the wavelength λ'1 and to reflect only light having wavelength λ'1. The fiber grating FG2 has a function to pass wavelengths other than the wavelength λ'2 and to reflect only light having wavelength λ'2. Other fiber gratings have similar function.

Figure 2A:
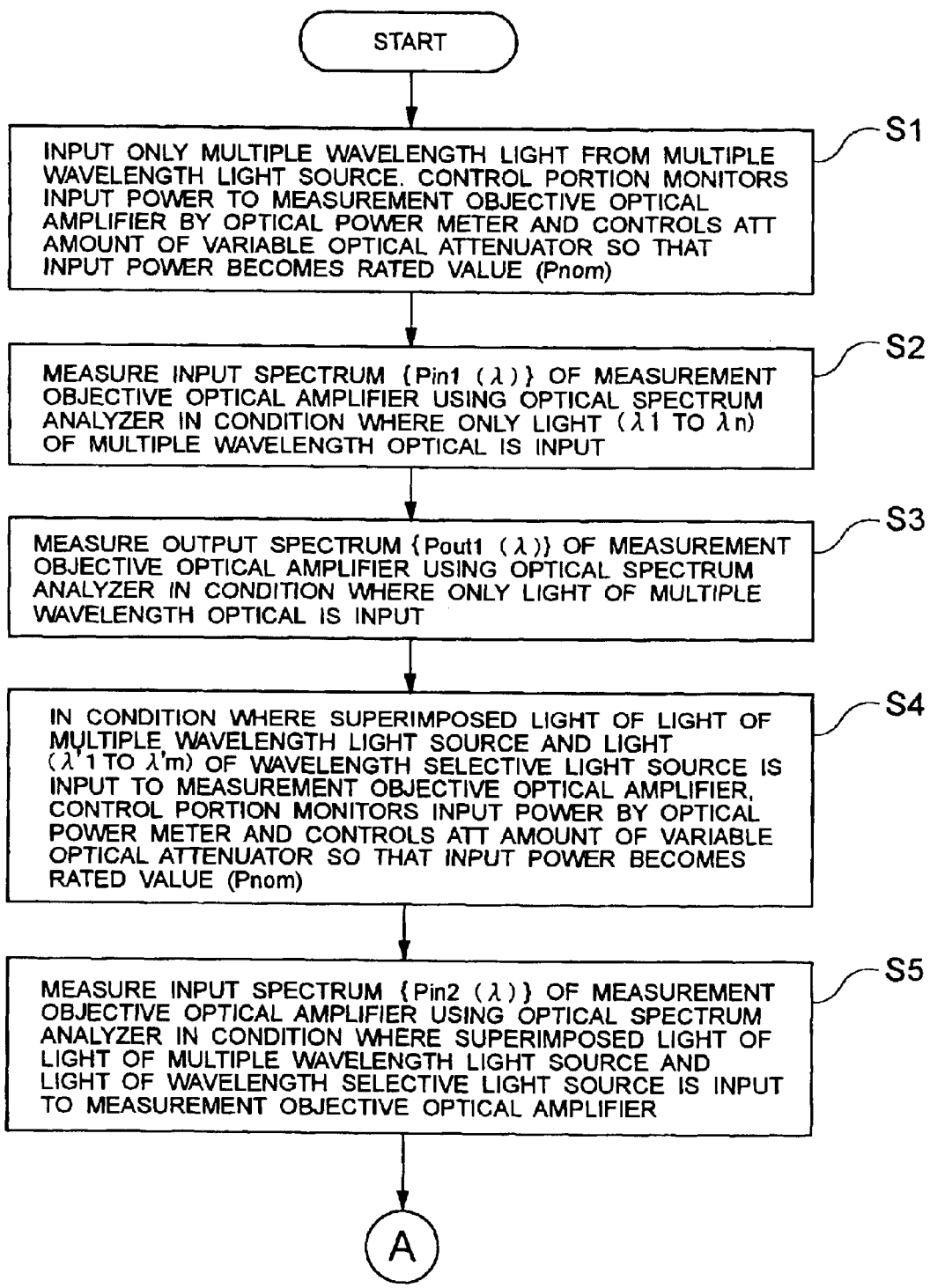
FIG. 2 is a flowchart showing operation of the preferred embodiment of the gain measurement device according to the present invention.
Figure 2B:
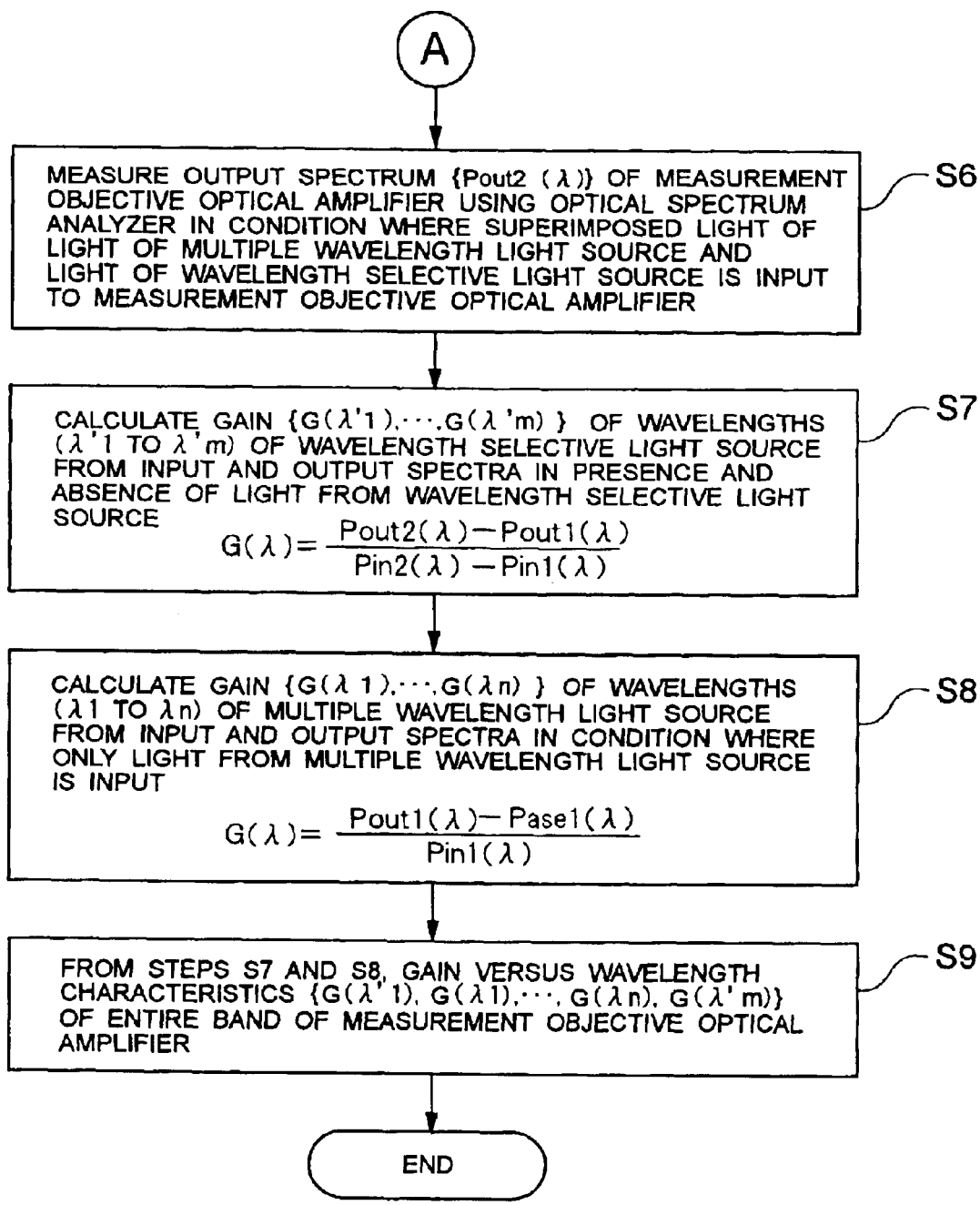

It should be clear that the operational flowchart shown in FIG. 2 can be easily implemented by preliminarily storing the operation procedure on a storage medium as a program and by performing operation according to the procedure with loading the program in a computer. On the other hand, the measurement objective optical amplifier may be Erbium doped optical fiber amplifier, semiconductor amplifier and so forth.

As set forth above, by the present invention, the gain versus wavelength characteristics of the optical amplifier can be measured easily at high speed and high precision with quite simple construction. The reason is that instead of injecting the probe light with sequentially sweeping over the entire measurement wavelength points other than saturated light from the multiple wavelength light source, the probe light is injected simultaneously. Therefore, the gain versus wavelength characteristics can be measured easily at high speed and high precision within a short period only by measuring the input spectrum of the entire measurement band under two conditions of presence and absence of the wavelength selective light (probe light).

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A gain measurement device for measuring a gain versus wavelength characteristics of an optical amplifier, comprising:

a first light source outputting a light having a plurality of wavelengths for using in measurement of a plurality of wavelength points;

a second light source outputting a light having a plurality of wavelengths for using in measurement of a plurality of wavelength points other than said plurality of wavelength points;

means for selectively leading out one of said output of said first light source and a multiplexed output generated by multiplexing said output of said second light source with said output of said first light source; and measuring means for deriving said gain versus wavelength characteristics of said optical amplifier on the basis of input and output characteristics when the output of said first light source is supplied to said optical amplifier and input and output characteristics when said multiplexed output is supplied to said optical amplifier.

2. A gain measurement device as set forth in claim 1, wherein said second light source includes a wide band light source outputting a light of wide band covering entire measurement band of said optical amplifier, and optical filtering means having a filtering characteristics for passing light of all measuring wavelength points other than the wavelength points to be measured in connection with the light of said first light source with taking the output of the wide band light source as input and blocking otherwise.

3. A gain measurement device as set forth in claim 2, wherein said light filtering means includes a first arrayed-waveguide grating taking the output of said wideband light source as input to selectively demultiplex the light of entire measuring wavelength points other than the wavelength points to be measured in connection with the light of said first light source, and a second arrayed-waveguide grating multiplexing the lights demultiplexed by said first arrayed-waveguide grating.

4. A gain measurement device as set forth in claim 2, wherein said optical filtering means includes a circulator taking the output of said wide band light source as input for a first port, and a plurality of fiber grating cascade connected sequentially to output from a second port of said circulator reflecting light of the entire measuring wavelength points other than the wavelength points to be measured in connection with the light of said first light source, and an output from a third port of said circulator is taken as output of said optical filtering means.

5. A gain measurement device as set forth in claim 1, wherein said measuring means includes a spectrum analyzer measuring spectra of input and output when the output of said first light source is supplied to said optical amplifier and measuring spectra of input and output when said multiplexed output is supplied to said optical amplifier, and means for measuring said gain versus wavelength characteristics on the basis of results of measurement by said spectrum analyzer.

6. A gain measurement device as set forth in claim 1, which further comprises:

a variable optical attenuator controlling an input optical power to said optical amplifier;

an optical power meter measuring an input power to said optical amplifier; and control means for controlling said variable optical attenuator on the basis of an output of said optical power meter so that the input optical power becomes a rated value.

7. A gain measurement method for measuring a gain versus wavelength characteristics of an optical amplifier, comprising:

step of supplying a light having a plurality of wavelengths for using in measurement of a plurality of wavelength points from a first light source to an input of said optical amplifier;

step of multiplexing an output light from said first light source and an output light having a plurality of wavelengths from a second light source for using in measurement of wavelength points other than the wavelength points to be measured in connection with the light of said first light source to supply a multiplexed output to the input of said optical amplifier; and measuring step of deriving said gain versus wavelength characteristics of said optical amplifier on the basis of input and output characteristics when the output of said first light source is supplied to said optical amplifier and input and output characteristics when said multiplexed output is supplied to said optical amplifier.

8. A gain measurement method as set forth in claim 7, wherein said output light from said second light source is generated by operating a wide band light source for emitting a wide band light covering entire measurement band of said optical amplifier, and inputting the output of said wide band light source to optical filtering means having characteristics for passing light having entire measuring wavelength points other than the wavelength points to be measured in connection with the light of said first light source and blocking otherwise.

9. A gain measurement method as set forth in claim 7, wherein said measuring step comprises:

step of measuring spectra of input and output when the output of said first light source is supplied to said optical amplifier and spectra of input and output when said multiplexed output is supplied to said optical amplifier; and step of measuring said gain versus wavelength characteristics based on the results of measurement.

10. A gain measurement method as set forth in claim 7, which further comprises:

step of measuring an input optical power to said optical amplifier by means of an optical power meter;

step of controlling the input optical power to said optical amplifier on the basis of an output of said optical power meter so that said input power to said optical amplifier becomes a rated value.

11. A storage medium recording a program for implementing a gain measuring method for measuring a gain versus wavelength characteristics of an optical amplifier, said program comprising:

step of supplying a light having a plurality of wavelengths for using in measurement of a plurality of wavelength points from a first light source to an input of said optical amplifier;

step of multiplexing an output light from said first light source and an output light having a plurality of wavelengths from a second light source for using in measurement of wavelength points other than the wavelength points to be measured in connection with the light of said first light source to supply a multiplexed output to the input of said optical amplifier; and measuring step of deriving said gain versus wavelength characteristics of said optical amplifier on the basis of input and output characteristics when the output of said first light source is supplied to said optical amplifier and input and output characteristics when said multiplexed output is supplied to said optical amplifier.

* * * * *